United States Patent
Ting

(10) Patent No.: US 7,413,453 B2
(45) Date of Patent: *Aug. 19, 2008

(54) CARD CONNECTOR

(75) Inventor: Chien-Jen Ting, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/799,665

(22) Filed: May 1, 2007

(65) Prior Publication Data

US 2007/0259546 A1 Nov. 8, 2007

(30) Foreign Application Priority Data

May 2, 2006 (TW) ............................... 95207455 U

(51) Int. Cl.
*H01R 13/62* (2006.01)
(52) U.S. Cl. ....................................................... 439/159
(58) Field of Classification Search ................. 439/159, 439/328, 327, 157, 160
See application file for complete search history.

(56) References Cited

U.S. PATENT DOCUMENTS

| | | | |
|---|---|---|---|
| 7,018,222 B2 | 3/2006 | Chang | |
| 7,090,513 B2 * | 8/2006 | Kuo | 439/92 |
| 7,147,495 B2 * | 12/2006 | Kuo | 439/159 |
| 7,189,087 B2 * | 3/2007 | Taguchi | 439/159 |
| 7,189,088 B2 * | 3/2007 | Cheng et al. | 439/159 |
| 7,232,320 B2 * | 6/2007 | Kuo | 439/159 |
| 2006/0040561 A1 | 2/2006 | Molex | |
| 2006/0246757 A1 * | 11/2006 | Ting et al. | 439/159 |
| 2007/0042622 A1 * | 2/2007 | Chen et al. | 439/159 |
| 2007/0093099 A1 * | 4/2007 | Kuo | 439/159 |
| 2007/0141879 A1 * | 6/2007 | Wu | 439/159 |
| 2007/0218727 A1 * | 9/2007 | Ting et al. | 439/159 |
| 2007/0249201 A1 * | 10/2007 | Cheng et al. | 439/159 |
| 2007/0259547 A1 * | 11/2007 | Yu et al. | 439/159 |

* cited by examiner

*Primary Examiner*—Neil Abrams
*Assistant Examiner*—Phuong Nguyen
(74) *Attorney, Agent, or Firm*—Wei Te Chung

(57) ABSTRACT

A card connector adapted for receiving a card, comprises an insulating housing defining a card insertion/ejection direction; a plurality of contacts received in the insulating housing, an ejector and a holding member; The ejector comprises a positioning device, a resilient member and an ejecting member cooperating with the positioning device to eject the card directly. The holding member engages with the ejecting member to hold the card into the card connector after the card is inserted to electrically connect with the contacts.

8 Claims, 5 Drawing Sheets

CARD CONNECTOR

BACKGROUND OF THE INVENTION

1. Field of the Invention

The present invention is generally related to a card connector, and more particularly, to a card connector which can hold a card therein securely.

2. Description of Related Art

With the development of electronic appliances, an express card connector has been widely used to achieve data transmission between an express card and a corresponding electronic appliance. In order to assure transmission stability of data, the express card must be secured in the corresponding express card connector when the express card is in a working state.

However, at present, express card connectors, such as U.S. Pat. No. 7,018,222 and US Application Pub. No. 20060040561 disclosed, have no additional element to hold corresponding express cards therein securely. In this situation, when the express card is in working state, it can be easily drawn out of the express card connector by mistake so that data transmission is interrupted and the express card can be easily destroyed.

Hence, an improved card connector is required to overcome the disadvantages of the related art.

SUMMARY OF THE INVENTION

Accordingly, an object of the present invention is to provided a card connector which can hold a card therein securely.

To achieve the above objects, a card connector adapted for receiving a card, comprises an insulating housing defining a card insertion/ejection direction; a plurality of contacts received in the insulating housing, an ejector and a holding member; The ejector comprises a positioning device, a resilient member and an ejecting member cooperating with the positioning device to eject the card directly. The holding member engages with the ejecting member to hold the card into the card connector after the card is inserted to electrically connect with the contacts.

Other objects, advantages and novel features of the present invention will be drawn from the following detailed description of a preferred embodiment of the present invention with attached drawings.

DETAILED DESCRIPTION OF THE INVENTION

Figure 1:
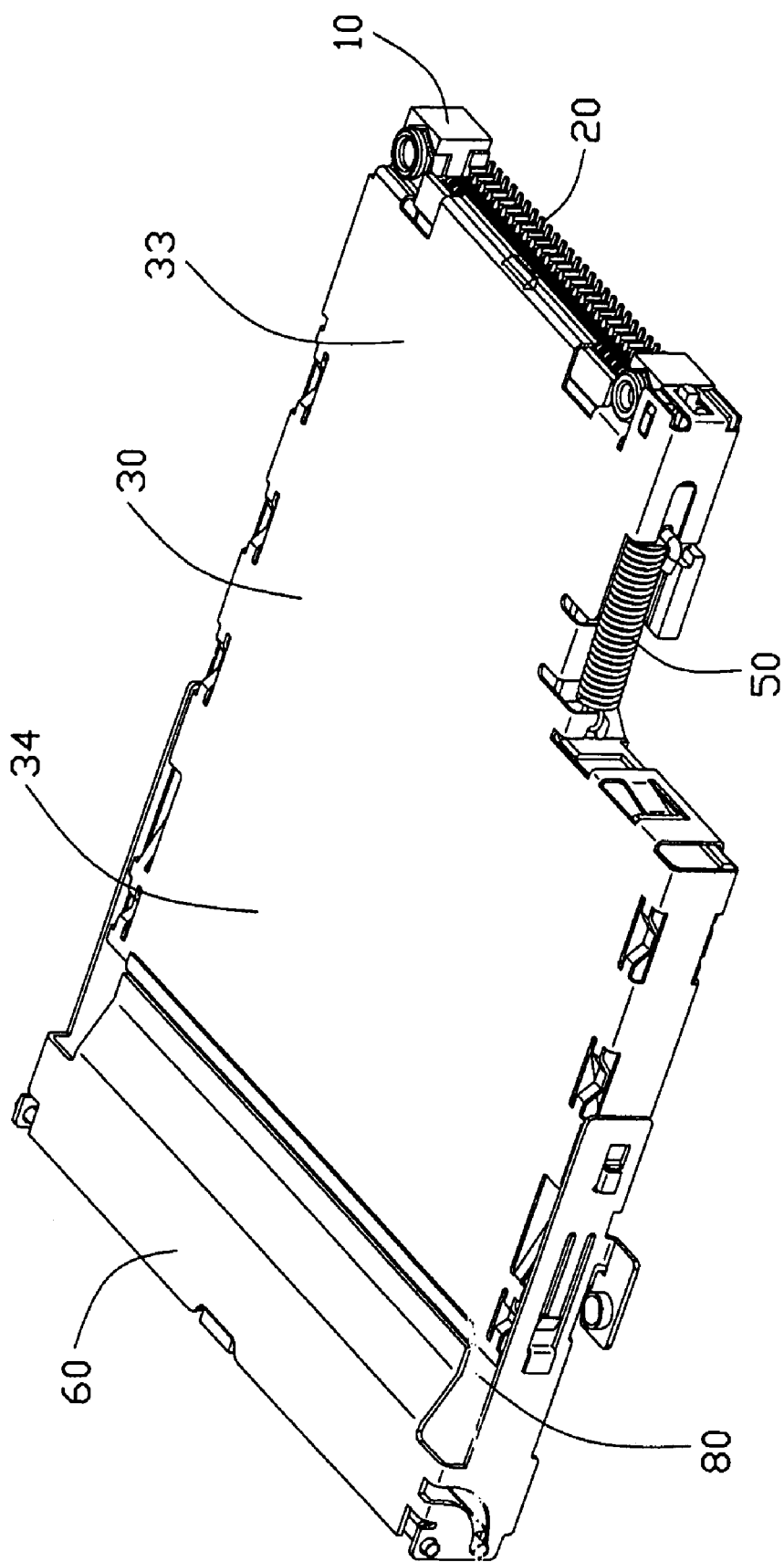
FIG. 1 is an assembled, perspective view of the card connector in accordance with the present invention.

Reference will now be made in detail to the preferred embodiment of the present invention.

Referring to FIGS. 1-5, a card connector is adapted for receiving a rectangular express card or a L-shaped express card. In this embodiment, the rectangular express card 100 is used to illustrate.

The card connector of the present invention comprises an elongated insulating housing 10, a plurality of contacts 20 received in, a shell 30, a guide element 40, an ejector 50 and a protection door 60 assembled on the shell 30.

Figure 2:
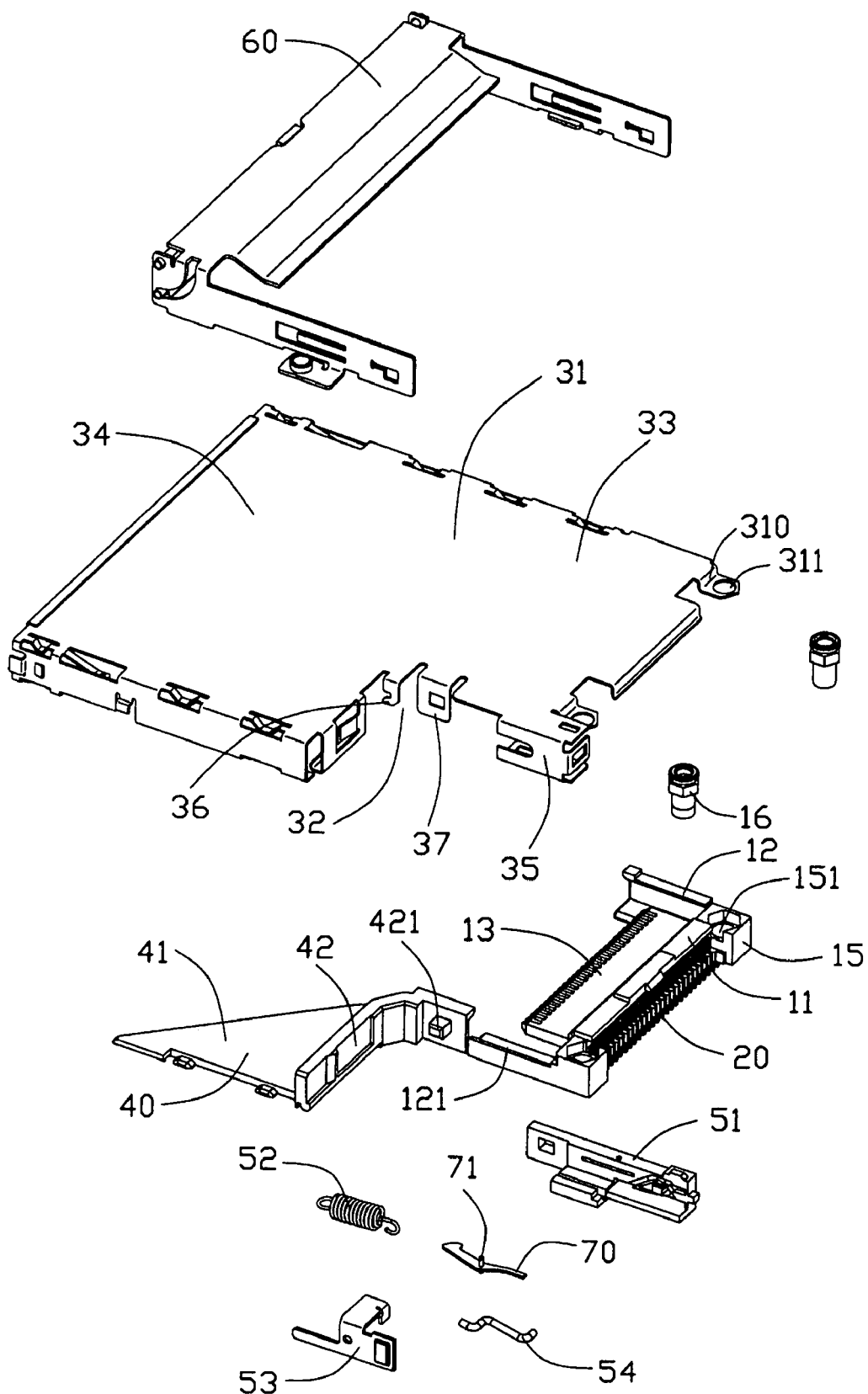
FIG. 2 is an exploded, perspective view of the card connector of FIG. 1.
Figure 3:
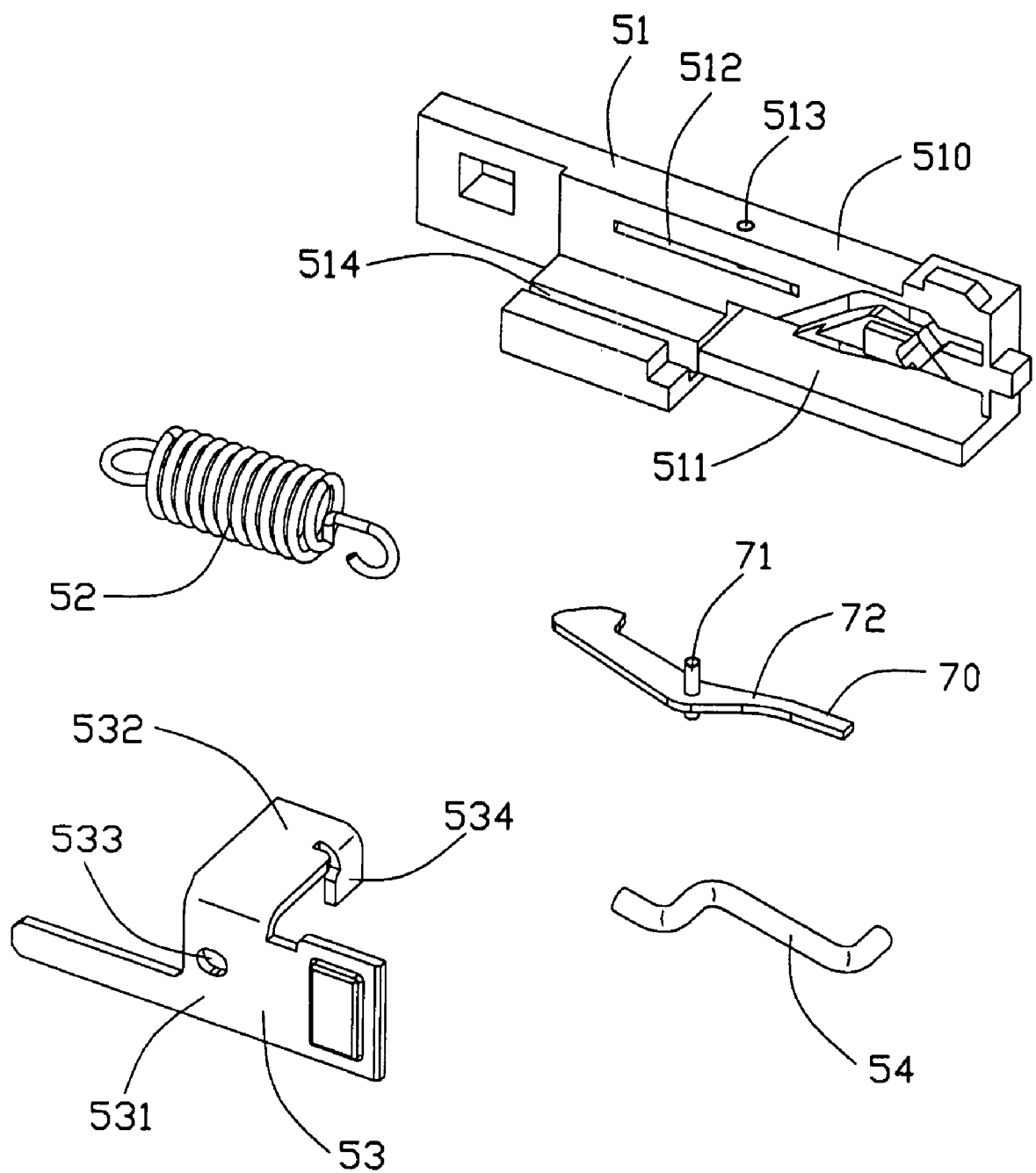
FIG. 3 is an exploded, perspective view of an ejector and a locking member of the card connector of FIG. 1.
Figure 4:
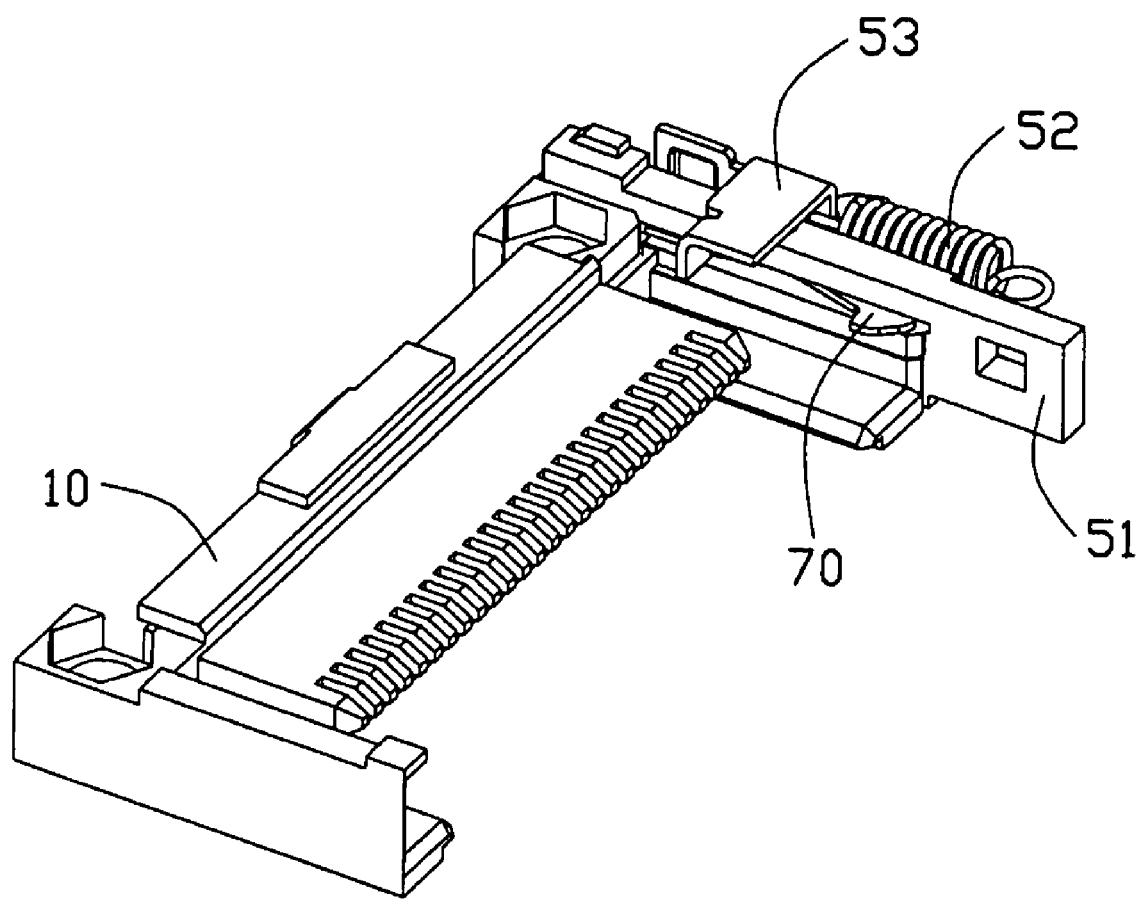
FIG. 4 is an assembled, perspective view of an insulating housing, the ejector and the locking member of the card connector of FIG. 1.
Figure 5:
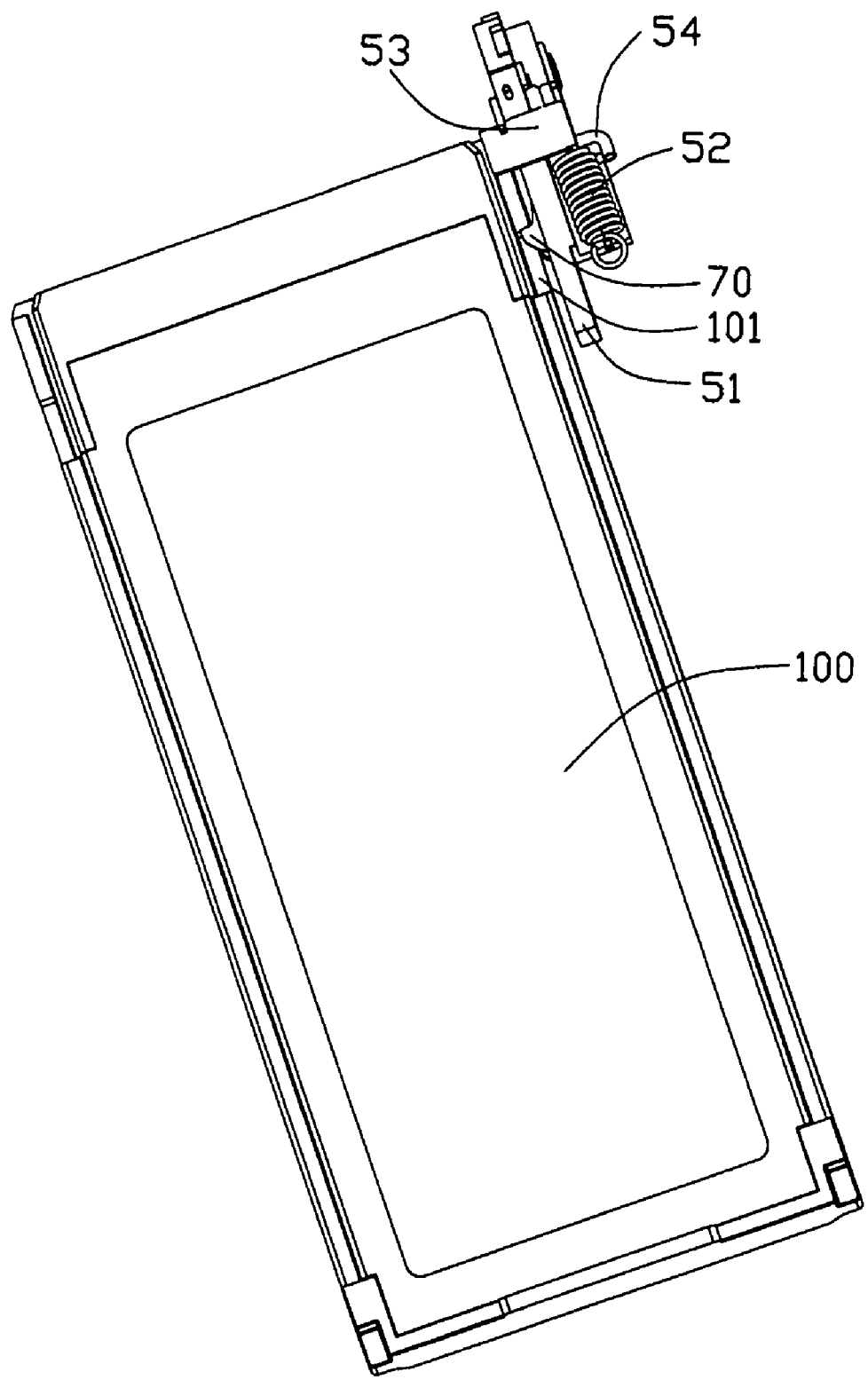
FIG. 5 is an assembled, perspective view showing an express card mating with the ejector and the locking member of the card connector.

Referring to FIGS. 2 and 3, The elongated insulating housing 10 has a base portion 11, a pair of guiding arms 12 and a pair of assembling plates 15 extending forwardly from opposite sides of the base portion 11 respectively. A mating portion 13 extends from a lower part of the base portion 11 and is disposed between the two guiding arms 12. The assembling plates 15 define column holes 151. The contacts 20 are received in the mating portion 13 and extend beyond the insulating housing 10 to be soldered on a circuit board (not shown).

The shell 30 covers the insulating housing 10 to define a card receiving space 80 with a card insertion opening (not labeled) therebetween. The shell 30 is L-shaped because the shell 30 defines a step portion 32 at front end thereof. The L-shaped shell 30 comprises a main body 31 and sidewalls (not labeled) extending downwardly from the main body 31. The main body 31 comprises a front section 33 and a rear section 34 extending rearward from the front section 33. The width of the rear section 34 is wider than that of the front section 33 along a transverse direction perpendicular to a card insertion/ejection direction. A locking piece 36, a holding piece 37 and a receiving portion 35 extend downwardly from a lateral side of the front section 33 adjacent to the step portion 32 and arrange along the card insertion direction. A pair of holding pieces 310 with through holes 311 are formed at opposite sides of a front end of the front section 33. Screws 16 are held in the column holes 151 of the insulating housing 10 and the through holes 311 of the shell 30 to assemble the shell 30 on the insulating housing 10. The protection door 60 is assembled on a rear end of the shell 30 to open/close the card insertion opening.

The guide element 40 is approximately a triangle shape and assembled to the shell 30 adjacent to the step portion 32. The guide element 40 has a board 41 and a L-shaped perpendicular wall 42 extending forwardly and upwardly from a front end of the board 70. The wall 42 is formed with a wedge 421 at an outside thereof to be received in the holding piece 37.

The ejector 50 comprises a base 51, a resilient member 52, an ejecting member 53 and a pin member 54. In this embodiment, the resilient member 52 is a spring. The base 51 abuts against the guiding arm 12 adjacent to the guide element 40 and a front end thereof is held in the receiving portion 35 of shell. The base 51 comprises a vertical portion 510 and a guiding portion 511 extending parallel and outwardly from a hemline of the vertical portion 510. A heart-shaped slot (not labeled) and an opening 512 are defined at a front end and approximately a middle portion of the vertical portion 510, respectively. A pivoting hole 513 is recessed downwardly from an upper face of the vertical portion 510 to communicate with the opening 512. The guiding arm 12 adjacent to the guide element 40 defines a cutout 121 communicating with the opening 512 and the card receiving space 80. The guiding portion 511 defines a guiding passageway 514 at a rear end thereof along the card insertion/ejection direction.

The ejecting member 53 is moveably assembled on the base 51. The ejecting member 53 comprises a sliding portion 531 sliding along the guiding passageway 514, a connecting portion 532 extending parallel from an upper portion of the sliding portion 531 and an ejecting portion 534 extending downwardly from a free end of the connecting portion 532 and exposed into the card receiving space 80 to eject a card directly.

One end of the pin member 54 locks in a hole 533 defined in the base 531 and the other end thereof is moveably received in the heart-shaped slot of the base 531. The pin member 54 maybe unitary with the ejecting member 53 and the pin member 54 and the heart-shaped slot serve as a positioning device. One end of the spring 52 locks on the locking portion 36 of the shell 30 and the other end thereof locks the pin member 54.

Referring to FIGS. 2-5, the card connector further comprises a holding member 70 and a pivot 71. The holding member 70 comprises a front end (not labeled) with a sloping surface 72 and a hooked rear end (not labeled) extending from the front end with an obtuse angle therebetween. The pivot 71 is disposed approximately at a middle portion of the holding member 70. The holding member 70 is exposed into the opening 512 and the hooked rear end thereof protrudes into the card receiving space 80. The pivot 71 is held in the pivoting hole 513 so that the holding member 70 is moveably assembled on the base 51.

The rectangular express card 100 defines a recess 101 at a lateral side of a front end thereof. When the card 100 inserted, the card 100 pushes the ejecting member 53 to move forwardly. Meantime, the spring 52 is stretched and the lateral side of the card 100 urges the hooked rear end of the holding member 70 to pivot into the opening 512. However, the ejecting portion 534 collides with a front end of the holding member to prevent the front end thereof from pivoting out of the opening 512. Thus, the lateral side of the card 100 collides with the hooked rear end so that the hooked rear end meets the recess 101. At this time, the pin member 54 cooperates with the heart-shaped slot to make the ejector 50 be in a locking position where the card 100 can electrically connect with the contacts 20 and the hooked rear end of the holding member 70 locks into the recess 101. In this situation, the card 100 cannot be drawn out the card connector by mistake because the holding member 70 locks the card 100.

When the card 100 ejected, pushing the card 100 forwardly again, the ejector 100 is released from the locking position and the ejecting portion 534 moves rearward along the sloping surface 72 of the holding member 70. Thus, the hooked rear end can move out of the recess 101 and the card 100 is ejected out of the card connector.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. A card connector adapted for receiving a card, comprising:
   an insulating housing defining a card insertion/ejection direction; a plurality of contacts received in the insulating housing;
   an ejector comprising a positioning device, a resilient member and an ejecting member cooperating with the positioning device to eject the card directly; and
   a holding member engaging with the ejecting member to hold the card into the card connector after the card is inserted to electrically connect with the contacts;
   the ejecting member collides with one end of the holding member to urge an opposite end of the holding member to lock the card when the card is inserted;
   the card defines a recess at a lateral side thereof and the holding member locks in the recess after the card is inserted; and
   the positioning device comprises a heart-shaped slot and a pin member with one end moveably disposed in the heart-shaped slot; an opposite end of the pin member is disposed on the ejecting member; the heart-shaped slot is defined at a base and the ejecting member is moveably assembled on the base; the base defines an opening and wherein the holding member is pivotally exposed into the opening; and the holding member is pivotally assembled on the base;
   the ejecting member is moveably assembled on the base; the ejecting member comprises a sliding portion sliding along a guiding passageway, a connecting portion extending parallel from an upper portion of the sliding portion and an ejecting portion extending downwardly from a free end of the connecting portion and exposed into a card receiving space to eject a card directly;
   the insulating housing has a pair of guiding arms and the holding member abuts against one of the guiding arms; and the one of guiding arms defines a cutout to communicate with the opening of the base; and a shell is approximately L-shaped.

2. The card connector as claim in claim 1, wherein the card defines a recess at a lateral side thereof and wherein the holding member locks in the recess after the card is inserted.

3. The card connector as claimed in claim 1, further comprising a shell covering the insulating housing to define a card receiving space therebetween.

4. The card connector as claimed in claim 3, wherein one end of the resilient member locks on the shell and the other end thereof locks on the pin member.

5. The card connector as claimed in claim 4, wherein the shell has a receiving portion for receiving one end of the base.

6. An electrical card connector for use with an electronic card, comprising:
   an insulative housing defining a mating portion;
   a plurality of contacts disposed in the housing with contacting sections extending into the mating port;
   an ejector including an ejecting member which is moveable relative to the housing in a front-to-back direction, and the ejecting member comprises a sliding portion sliding along a guiding passageway, a connecting portion extending parallel from an upper portion of the sliding portion and an ejecting portion extending downwardly from a free end of the connecting portion and exposed into a card receiving space to eject a card directly;
   the ejection portion for engagement with a front edge of the electronic card; and a holding member defining a projection for engagement within a notch of said electronic card for locking, wherein said holding member being immoveable relative to the housing in said front-to-back direction while the projection is moveable in a transverse direction depending upon whether said holding member is restrained by the ejecting member or not under a condition that the ejecting member restrains the holding member when the ejecting member is located in a rear position closer to the mating port, while releases the holding member when the ejecting member is located in a front portion away from the mating port.

7. The electrical card connector as claimed in claim 6, wherein the holding member is pivotally moveable.

8. An electrical card connector for use with an electronic card, comprising an insulative housing defining a mating portion;

a plurality of contacts disposed in the housing with contacting sections extending into the mating port;

an ejector including an ejecting member which is moveable relative to the housing in a front-to-back direction, and the ejecting member comprises a sliding portion sliding along a guiding passageway, a connecting portion extending parallel from an upper portion of the sliding portion and an ejecting portion extending downwardly from a free end of the connecting portion and exposed into a card receiving space to eject a card directly; and has an ejection portion for engagement with a front edge of the electronic card; and a holding member defining a projection for engagement within a notch of said electronic card for locking, wherein the holding member is pivotally, rather than deflectably, moveable to decide whether the projection is engaged within or disengaged from the notch of the card or not;

said holding member is pivotal about a pivot, and defines an engagement section, which is located on an opposite side of the pivot with regard to the projection, to be engageable with the ejecting member so as to decide whether the holding member is allowed to be pivotally moveable for engagement within or disengagement from the notch of the card;

said holding member is immoveable relative to the housing along the front-to-back direction.

* * * * *